(12) United States Patent
Du et al.

(10) Patent No.: US 12,245,478 B2
(45) Date of Patent: Mar. 4, 2025

(54) DISPLAY PANEL, DISPLAY DEVICE AND TERMINAL DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Lili Du, Beijing (CN); Yudiao Cheng, Beijing (CN); Yue Long, Beijing (CN); Weiyun Huang, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/789,301

(22) PCT Filed: May 13, 2021

(86) PCT No.: PCT/CN2021/093562
§ 371 (c)(1),
(2) Date: Jun. 27, 2022

(87) PCT Pub. No.: WO2022/236765
PCT Pub. Date: Nov. 17, 2022

(65) Prior Publication Data
US 2024/0188355 A1 Jun. 6, 2024

(51) Int. Cl.
*H01L 21/00* (2006.01)
*H10K 59/131* (2023.01)

(52) U.S. Cl.
CPC ................... *H10K 59/131* (2023.02)

(58) Field of Classification Search
CPC ..................................................... H10K 59/131
See application file for complete search history.

(56) References Cited

U.S. PATENT DOCUMENTS

2018/0366529 A1* 12/2018 Lee ..................... H10K 59/1213
2019/0221604 A1* 7/2019 Oh ....................... H01L 25/0753
(Continued)

FOREIGN PATENT DOCUMENTS

| CN | 110491917 A | 11/2019 |
| CN | 110942746 A | 3/2020 |

(Continued)

OTHER PUBLICATIONS

Written Opinion from PCT/CN2021/093562 dated Jan. 29, 2022.
International Search Report from PCT/CN2021/093562 dated Jan. 29, 2022.

*Primary Examiner* — Richard A Booth
(74) *Attorney, Agent, or Firm* — Calfee, Halter & Griswold LLP

(57) ABSTRACT

The present disclosure is related to a display panel, a display device and a terminal device. The display panel includes a driving backplate, an interconnection layer and a light-emitting layer. Pixel circuits in a driving region include first and second pixel circuits. The driving backplate has first interconnection holes, and any one of the pixel circuits is connected to one of the first interconnection holes. An interconnection region of the interconnection layer includes two interconnection portions each of which has second interconnection holes. First and second interconnection holes connected to the same lead are located in the same hole row to form a hole group. First and second interconnection holes in one of two adjacent hole groups are located between first and second interconnection holes in the other hole group.

20 Claims, 9 Drawing Sheets

(56) References Cited

U.S. PATENT DOCUMENTS

| | | |
|---|---|---|
| 2020/0098313 A1 | 3/2020 | Qingfang |
| 2020/0194532 A1 | 6/2020 | Donghyun et al. |
| 2021/0012706 A1 | 1/2021 | Xingxing et al. |
| 2022/0036795 A1* | 2/2022 | Lou ................... H10K 59/123 |

FOREIGN PATENT DOCUMENTS

| | | |
|---|---|---|
| CN | 111326547 A | 6/2020 |
| CN | 111785761 A | 10/2020 |
| CN | 111916486 A | 11/2020 |
| CN | 112086492 A | 12/2020 |
| CN | 112151592 A | 12/2020 |
| CN | 112271203 A | 1/2021 |
| CN | 112490274 A | 3/2021 |
| CN | 212874001 U | 4/2021 |
| EP | 3627484 A1 | 3/2020 |
| IN | 111063719 A | 4/2020 |

* cited by examiner

DISPLAY PANEL, DISPLAY DEVICE AND TERMINAL DEVICE

RELATED APPLICATIONS

The present application is the national stage entry of and claims priority to a International patent application No. PCT/CN2021/093562, filed May 13, 2022, and entitled "Display Panel, Display Device and Terminal Device", the entire contents of which are incorporated herein by reference.

TECHNICAL FIELD

Embodiments of the present disclosure generally relate to the display technical field, and more particularly, to a display panel, a display device and a terminal device.

BACKGROUND

For the screen of an electronic device with a camera such as a mobile phone or a tablet computer, a region of the screen corresponding to the camera usually needs to have a hole-punch, and thus no light can be emitted, which is not conducive to improving the screen-to-body ratio. At present, although there is a under-screen camera technology that enables the region where the camera is located to display images without the need of a hole-punch and allows normal shooting, but the region of the screen corresponding to the camera is prone to color shift when displaying images, especially the phenomenon of color shift to a more greenish tone, and this will affect the display effect.

It should be noted that the information disclosed in the Background section is only for enhancing understanding of the background of the present disclosure, and therefore may include information that does not form the prior art known to a person of ordinary skill in the art.

SUMMARY

An objective of the present disclosure is to provide a display panel, a display device and a terminal device.

According to an aspect of the present disclosure, there is provided a display panel, including:

a driving backplate having a light-transmitting region and a driving region at least partially surrounding outside of the light-transmitting region, wherein the driving region has a plurality of pixel circuits, the plurality of pixel circuits include first pixel circuits and second pixel circuits, the driving backplate has a plurality of first interconnection holes, and any one of the pixel circuits is connected to one of the first interconnection holes;

an interconnection layer arranged on a side of the driving backplate and covering the light-transmitting region and the driving region, wherein:

the interconnection layer includes a plurality of lead layers which are mutually apart from each other, and each of the lead layers includes a plurality of leads which are mutually apart from each other;

the interconnection layer has an interconnection region corresponding to the light-transmitting region and a wiring region corresponding to the driving region, and the interconnection region includes two interconnection portions separated on both sides of a first central axis;

the first central axis is a central axis of the interconnection region extending along a column direction;

each of the interconnection portions has a plurality of second interconnection holes, and any one of the second interconnection holes is connected with one of the first interconnection holes through one of the leads; and a light-emitting layer arranged on a side of the interconnection layer away from the driving backplate and including a plurality of light-emitting devices, wherein the light-emitting devices includes a plurality of first light-emitting devices in the interconnection portions and a plurality of second light-emitting devices in the wiring region, any one of the first light-emitting devices is connected to one of the second interconnection holes, and any one of the second light-emitting devices is connected to one of the first interconnection holes;

wherein the first interconnection holes and the second interconnection holes are arranged in a plurality of hole rows distributed along the column direction, the second interconnection holes are arranged in a part of the hole rows, a first interconnection hole and a second interconnection hole which are connected to a same lead are in a same hole row to form a hole group; in two adjacent hole groups, a first interconnection hole and a second interconnection hole in one of the two adjacent hole groups are arranged between a first interconnection hole and a second interconnection hole in another one of the two adjacent hole groups;

wherein a length of any one of the leads in a row direction is the same as a distance between a first interconnection hole and a second interconnection hole which are connected to the lead, or the length of any one of the leads in the row direction differs from the distance between the first interconnection hole and the second interconnection hole which are connected to the lead by a specified length.

In an example embodiment of the present disclosure, there are N hole rows, and each of the second interconnection holes is arranged in one of i-th to j-th hole rows, N, i and j are positive integers, and $1 \leq i \leq j \leq N$;

wherein in any two adjacent hole rows of the i-th to j-th hole rows, leads connected to at least a part of the second interconnection holes in one of the two adjacent hole rows are arranged between the two adjacent hole rows.

In an example embodiment of the present disclosure, leads connected to second interconnection holes in a k-th hole row are arranged between (k−1)-th and k-th hole rows, k is positive integer, and $i < k \leq j$;

wherein leads connected to second interconnection holes in the i-th hole row are arranged on a side of the i-th hole row away from the j-th hole row.

In an example embodiment of the present disclosure, in at least one hole row of the i-th to j-th hole rows, partial regions of leads connected to at least a part of second interconnection holes are arranged on a side of the i-th hole row away from the j-th hole row.

In an example embodiment of the present disclosure, the wiring region includes a main body region and a peripheral region, the main body region at least partially surrounds outside of the interconnection region, and the peripheral region surrounds outside of the main body region and the interconnection region; at least part of the first pixel circuits are distributed in a region of the driving backplate corresponding to the main body region;

wherein at least partial regions of leads connected to at least a part of second interconnection holes in the i-th hole row are arranged in the peripheral region.

In an example embodiment of the present disclosure, in at least one of the i-th to j-th hole rows, at least partial regions of leads connected to at least a part of second interconnection holes are arranged on a side of the j-th hole row away from the i-th hole row.

In an example embodiment of the present disclosure, each of the interconnection portions includes a plurality of sub-regions distributed along the row direction, and each of the sub-regions is provided with the second interconnection holes;

wherein leads connected to second interconnection holes in a same sub-region are arranged in a same lead layer.

In an example embodiment of the present disclosure, the plurality of the lead layers at least include a first lead layer, a second lead layer and a third lead layer which are sequentially distributed from the driving backplate to the light-emitting layer, leads of the first lead layer include first leads, leads of the second lead layer include second leads, and leads of the third lead layer include third leads;

wherein sub-regions of a same interconnection portion include a first sub-region, a second sub-region and a third sub-region that are sequentially distributed along the row direction toward the first central axis, leads connected to second interconnection holes in the first sub-region are the first leads, leads connected to second interconnection holes in the second sub-region are the second leads, and leads connected to second interconnection holes in the third sub-region are the third leads.

In an example embodiment of the present disclosure, in response to i<k≤j:

a first lead, a second lead and a third lead connected to second interconnection holes in a k-th hole row are arranged between (k−1)-th and k-th hole rows;

wherein a first lead, a second lead and a third lead connected to second interconnection holes in an i-th hole row are arranged on a side of the i-th hole row away from a j-th hole row.

In an example embodiment of the present disclosure, the leads of the first lead layer further include fourth leads;

sub-regions of the same interconnection portion include a fourth sub-region arranged between the third sub-region and the first central axis, and leads connected to second interconnection holes in the fourth sub-region are the fourth leads;

at least partial regions of at least a part of the fourth leads are arranged on a side of the i-th hole row away from the j-th hole row; and at least partial regions of at least a part of the fourth leads are arranged on a side of the j-th hole row away from the i-th hole row.

In an example embodiment of the present disclosure, the fourth sub-region includes a first sub-division and a second sub-division separated on both sides of a second central axis, the second central axis is a central axis of the interconnection region extending along the row direction, a part of second interconnection holes in the i-th to k-th hole rows are arranged in the first sub-division, and a part of second interconnection holes in the (k+1)-th to j-th hole rows are arranged in the second sub-division, k+1≤j;

wherein at least partial regions of the fourth leads connected to second interconnection holes in the first sub-division are arranged on the side of the i-th hole row away from the j-th hole row; and wherein at least partial regions of the fourth leads connected to second interconnection holes in the second sub-division are arranged on the side of the j-th hole row away from the i-th hole row.

In an example embodiment of the present disclosure, each of the leads includes two lead-out sections and an extension section connecting the two lead-out sections, the lead-out sections extend along the column direction, and the extension section extends along the row direction;

wherein a length of the extension section of any one of the first lead, the second lead and the third lead is the same as a distance between a first interconnection hole and a second interconnection hole which are connected to the any one of the first lead, the second lead and the third lead.

In an example embodiment of the present disclosure, in response to i<k<j:

each of lead-out sections of one of the fourth leads connected to the k-th hole row includes a first section, a second section and a third section distributed along the column direction, one end of the first section is connected to one of the second interconnection holes and the other end of the first section is connection to one end of the second section, the other end of the second section is connected to one end of the third section, and the other end of the third section is connection to one end of the extension section;

the first section and the third section extend linearly along the column direction, and the third section is arranged on a side of a second interconnection hole connected to the first section away from or close to the first central axis; and the length of the extension section of each of the fourth leads connected to the k-th hole row differs from a distance between a first interconnection hole and a second interconnection hole connected to the each of the fourth leads by a specified length.

In an example embodiment of the present disclosure, a length of an extension section of each of the fourth leads connected to the i-th and j-th hole rows is the same as a distance between a first interconnection hole and a second interconnection hole connected to the each of the fourth leads.

In an example embodiment of the present disclosure, a fourth lead connected to a second interconnection hole in the first sub-division and a fourth lead connected to a second interconnection hole in the second sub-division are symmetrically arranged with respect to the second central axis.

In an example embodiment of the present disclosure, leads connected to the second interconnection holes in the two interconnection portions are symmetrically arranged with respect to the first central axis.

In an example embodiment of the present disclosure, the light-emitting device includes:

a first electrode arranged on a surface of the interconnection layer away from the driving backplate, wherein the first electrode has an electrode portion and a wiring portion arranged outside an edge of the electrode portion, and the wiring portion is connected to one of the leads through one of the second interconnection holes;

a light-emitting functional layer arranged on a surface of the first electrode away from the driving backplate; and a second electrode arranged on a surface of the light-emitting functional layer away from the driving backplate.

According to another aspect of the present disclosure, there is provided a display device, including the display panel according to any one of above example embodiments.

According to another aspect of the present disclosure, there is provided a terminal device, including:

the display device according to any one of above example embodiments; and a camera device arranged on a side of the driving backplate away from the light-emitting layer, wherein the side of the driving backplate is a side opposite to a light-emitting direction, the camera device is arranged facing the light-transmitting region, and the camera device is used for capturing images through the light-transmitting region.

It is to be understood that the foregoing general description and the following detailed description are exemplary and explanatory only and are not intended to impose undue limitations on the present disclosure.

BRIEF DESCRIPTION OF THE DRAWINGS

The accompanying drawings, which are incorporated in and constitute a part of the description, illustrate embodiments consistent with the disclosure and serve to explain principles of the disclosure together with the description. Obviously, the drawings in the following description are only some embodiments of the present disclosure, and for those of ordinary skill in the art, other drawings can be obtained from these drawings without creative effort.

Figure 1:
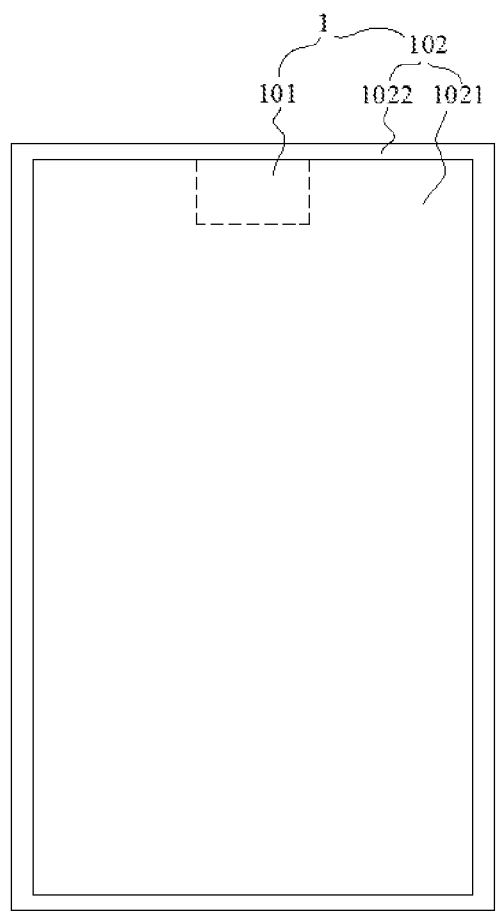
FIG. 1 is a schematic diagram of a driving backplate in a display panel according to an embodiment of the present disclosure.

Listing of main reference numbers:

1: driving backplate; 101: light-transmitting region; 102: driving region; 1021: pixel region; 1022: peripheral region; 10: pixel circuit; 110: first pixel circuit; 120: second pixel circuit; 100: first interconnection hole;

2: interconnection layer; 210: interconnection region; 2101: interconnection portion; 21011: sub-region; 21011a: first sub-region; 21011b: second sub-region; 21011c: third sub-region; 21011d1: first sub-division; 21011d2: second sub-division; 220: wiring region; 21: lead layer; 211: lead; 21a: first lead layer; 211a: first lead; 21b: second lead layer; 211b: second lead; 21c: third lead layer; 211c: third lead; 211d: fourth lead; 201: interconnection hole; 2110: lead-out section; 21101: first section; 21102: second section; 21103: third section; 2120: extension section; 22: first planarization layer; 23: second planarization layer; 24: third planarization layer;

3: light-emitting layer; 30: light-emitting device; 301: first light-emitting device; 302: second light-emitting device; 311: first electrode; 3111: electrode portion; 3112: wiring portion; 312: light-emitting functional layer; 313: second electrode; 314: pixel definition layer; 301: first light-emitting device; 302: second light-emitting device;

001: hole row; 002: hole group;

1000: display device; 2000: camera device.

DETAILED DESCRIPTION

Example embodiments will now be described more fully with reference to the accompanying drawings. However, the embodiments can be implemented in a variety of forms and should not be construed as being limited to the examples set forth herein; rather, these embodiments are provided so that the present disclosure will be more complete so as to convey the idea of the example embodiments to those skilled in this art. The same reference signs in the drawings indicate the same or similar structures, and thus their repeated descriptions will be omitted. In addition, the drawings are only schematic illustrations of embodiments of the present disclosure, and are not necessarily drawn to scale.

The terms "a", "an", "the", "said" and "at least one" are used to indicate the presence of one or more elements/components/etc.; the terms "include" and "have" are open terms and means inclusive, and refers to that in addition to the listed elements/components and so on, there may be other elements/components and so on. The terms "first", "second" and "third" etc. are used only as markers and are not intended to limit the number of associated objects.

In the related art, a display panel for realizing under-screen camera has a light-transmitting region and a driving region outside the light-transmitting region, and both the light-transmitting region and the driving region are provided with a plurality of light-emitting devices. Also, pixel circuits for driving all light-emitting devices are arranged in the driving region, and there are no pixel circuits in the light-transmitting region, so as to improve the degree of light transmission, and accordingly images can be captured by the camera device through the light-transmitting region. In order to facilitate driving of the light-emitting devices in the light-transmitting region to emit light, the light-emitting devices in the light-transmitting region can be connected to corresponding pixel circuits in the driving region through leads extending from the light-transmitting region to the driving region, and the light-emitting devices in the driving region are directly connected to corresponding pixel circuits in the driving region.

The light-emitting devices include at least light-emitting device which emit red light, light-emitting device that emit green light and light-emitting devices that emit blue light. Due to the different light-emitting materials of light-emitting devices which emit different colors, there are differences in their response times, resulting in different turn-on times. It has been verified by experiments that the turn-on time of the green light-emitting devices is usually later than that of the red light-emitting devices and the blue light-emitting devices even when the driving signals are simultaneously received.

Due to the parasitic capacitance between leads and the parasitic capacitance between the leads and other conductive film layers such as the pixel circuits, different degrees of delay are caused to the turn-on times of the light-emitting devices. After such delay is superimposed with the inherent delay of the light-emitting devices, a color shift visible to the human eye appears on the screen. In particular, the green light-emitting devices emit light significantly later than the red light-emitting devices and the blue light-emitting devices, and before the green light-emitting devices emit light, there are only red and blue in images, thus showing purple stripes or other purplish images.

In order to reduce the influence of the parasitic capacitance of the leads, the area of overlapping regions can be adjusted by changing the lengths of the leads, so that the parasitic capacitance of different leads tends to be consistent, but this will make the lengths of the leads vary greatly and lack regularity. The lead paths need to be specially designed according to different overlapping regions, and since there are many overlapping film layers and the structure is complex, the parasitic capacitance cannot be truly consistent.

Based on the above analysis, an embodiment of the present disclosure provides a display panel, which may be an Organic Light-Emitting Diode (OLED) display panel. As shown in FIG. 1, FIG. 2, and FIGS. 5 to 10, the display panel includes a driving backplate 1, an interconnection layer 2 and a light-emitting layer 3.

The driving backplate 1 has a light-transmitting region 101 and a driving region 102 at least partially surrounding the light-transmitting region 101. The driving region 102 has a plurality of pixel circuits 10. The plurality of pixel circuits 10 include first pixel circuits 110 and second pixel circuits 120. The driving backplate 1 has a plurality of first interconnection holes 100, and each of the pixel circuits 10 is connected to one of the first interconnection holes 100.

The interconnection layer 2 is arranged on a side of the driving backplate 1 and covers the light-transmitting region 101 and the driving region 102. The interconnection layer 2 includes a plurality of lead layers 21 which are mutually apart from each other. Each of the lead layers 21 includes a plurality of leads 211 which are mutually apart from each other. The interconnection layer 2 has an interconnection region 210 corresponding to the light-transmitting region 101 and a wiring region 220 corresponding to the driving region 102. The interconnection region 210 includes two interconnection portions 2110 separated on both sides of a first central axis S1. The first central axis S1 is a central axis of the interconnection region 210 extending along a column direction. Each of the interconnection portions 2101 has a plurality of second interconnection holes 201, and each of the second interconnection holes 201 is connected with one of the first interconnection holes 100 through one of the leads 211.

The light-emitting layer 3 is arranged on a side of the interconnection layer 2 away from the driving backplate 1 and includes a plurality of light-emitting devices 30. The light-emitting devices 30 include a plurality of first light-emitting devices 301 in the interconnection portions 2101 and a plurality of second light-emitting devices 302 in the wiring region 220. The first light-emitting devices 301 are connected to the second interconnection holes 201 in a one-to-one correspondence, and the second light-emitting devices 302 are connected to the first interconnection holes 100 in a one-to-one correspondence.

The first interconnection holes 100 and the second interconnection holes 201 are arranged in a plurality of hole rows 001 distributed along the column direction. The second interconnection holes 201 are arranged in a part of the hole rows 001. A first interconnection hole 100 and a second interconnection hole 201 which are connected to a same lead 21 are in a same hole row 001 to form a hole group 002. In two adjacent hole groups 002, a first interconnection hole 100 and a second interconnection hole 201 in one of the two adjacent hole groups 002 are arranged between a first interconnection hole 100 and a second interconnection hole 200 in another one of the two adjacent hole groups 002.

The length of any one of the leads 21 in a row direction is the same as a distance between a first interconnection hole 100 and a second interconnection hole 201 which are connected to the lead, or the length of any one of the leads 21 in the row direction differs from the distance between the first interconnection hole 100 and the second interconnection hole 201 which are connected to the lead by a specified length.

It should be noted that in embodiments of the present disclosure, the row direction may be the X direction in FIGS. 7 to 10, and the column direction may be the Y direction in FIGS. 7 to 10. However, those skilled in the art can know that if the display panel is rotated, the actual orientations of the row direction and the column direction may change, and are not limited to the X and Y directions in the figures. The row direction and the column direction in embodiments of the present disclosure refers to two directions that are perpendicular to each other.

In the display panel according to the embodiments of the present disclosure, the first pixel circuits 110 for driving the first light-emitting devices 301 are arranged in the driving region 102 outside the light-transmitting region 101, and accordingly the degree of light transmission of the light-transmitting region 101 is increased to facilitate image capturing of the camera device without reduction in the number of the light-emitting devices 30. Also, the first light-emitting devices 301 in the light-transmitting region 101 are connected to the first pixel circuits 110 through the leads 211 in the multi-layered lead layers 21 and the first and second interconnection holes 100 and 201, so that the light-transmitting region 101 can display images normally, and the plurality of lead layers 21 can increase the layout space of the leads 211. In the case where there are many first light-emitting devices 301 within the range of the light-transmitting region 101, each first light-emitting device 301 can still be connected to one of the first pixel circuits 110 to avoid reducing the number of the first light-emitting devices 301 due to insufficient leads 211. The second light-emitting devices 302 are connected to the second pixel circuits 120 and thus images can be displayed outside the light-transmitting region 101.

In addition, in any hole group 002, the length of a lead 21 in the row direction is the same as the distance between corresponding first interconnection hole 100 and second interconnection hole 201 or is different from the distance between corresponding first interconnection hole 100 and second interconnection hole 201 by a specified length. Thus, if the distance between the first interconnection hole 100 and second interconnection hole 201 which are connected with each other is known, the length of the lead 21 connecting the two interconnection holes in the row direction can be determined. Accordingly, the driving signal can be controlled by means of external compensation to at least compensate for the delay of the turn-on time caused by the lead 21, thereby avoiding the color shift. The external compensation method may be external optical compensation (demura) or other methods, as long as the turn-on times of different first light-emitting devices 301 can be supplemented to make them tend to be consistent.

Taking external optical compensation as an example, at least the following steps may be performed to conduct the compensation:

The display panel is caused to display a test image.

A camera device is used to capture the test image. By analyzing the captured image, a color shift region in the light-transmitting region 101 is recognized.

Compensation data is generated according to the display data of the identified color shift region, the lead length, and a preset compensation algorithm. The display data may include luminance values and timings of luminance values, and the like. As long as the distance between the connected first interconnection hole 100 and the second interconnection hole 201 is known, the length of the lead 21 connecting the two interconnection holes in the row direction can be determined. As compared with irregular setting of the extension path of the lead 21, the method in embodiments of the present disclosure can more easily determine the compensation algorithm in advance.

The compensation data is stored in an internal or external control circuit of the display panel. When driving the display panel to display images, the driving signal for the first light-emitting device 301 that causes color shift can be compensated by the compensation data, thereby eliminating the color shift.

The following describes the display panel according to embodiments of the present disclosure in detail.

As shown in FIG. 1, the driving backplate 1 is provided with pixel circuits 10 for driving the light-emitting devices 30 to emit light, and the driving backplate 1 at least includes a light-transmitting region 101 and a driving region 102 outside the light-transmitting region 101. The pixel circuits 10 are located in the driving region 102, and the pixel circuits 10 are not arranged in the light-transmitting region 101 to improve transparency. The camera device can capture images through the light-transmitting region 101, thereby realizing under-screen photography.

Figure 2:
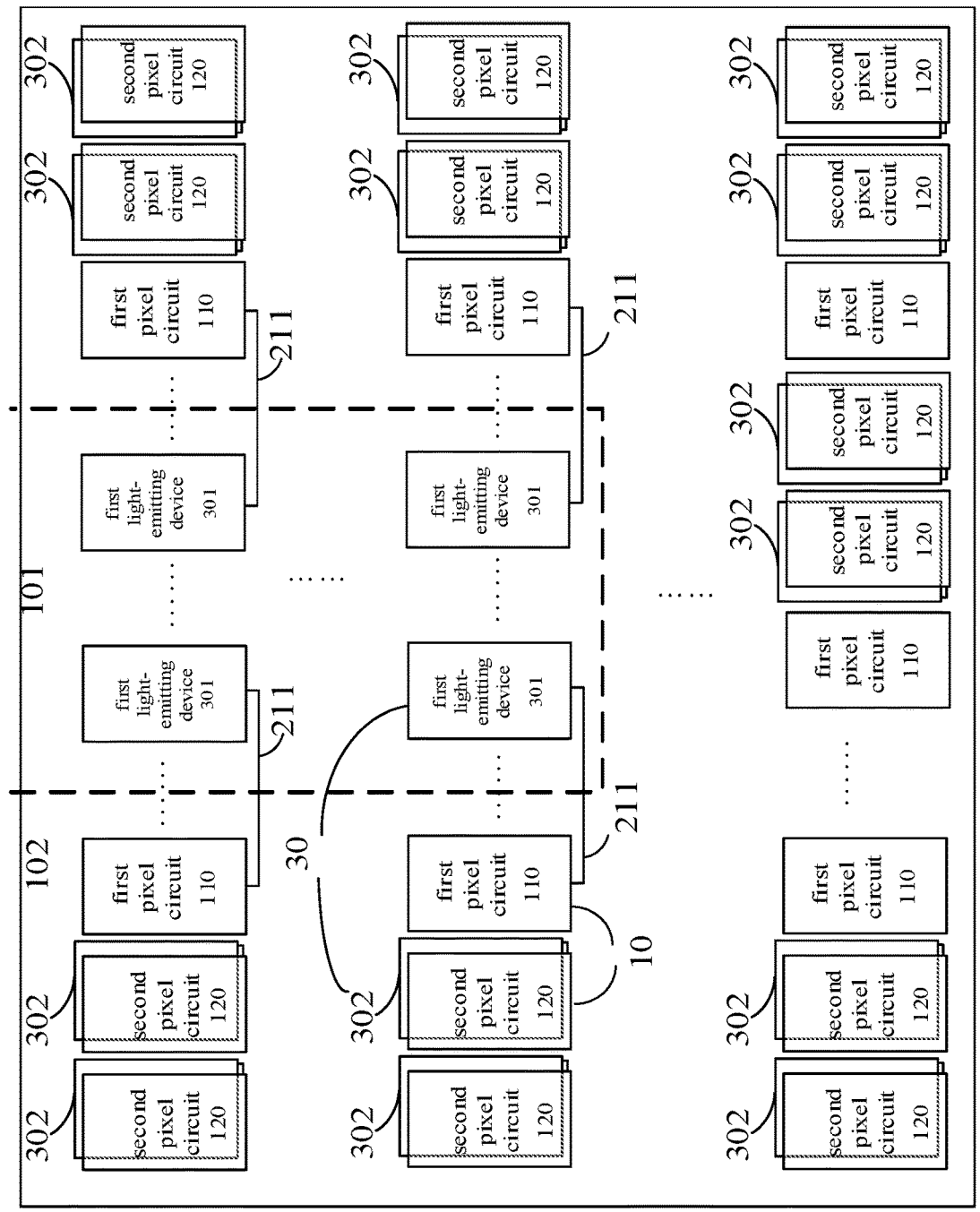
FIG. 2 is a schematic diagram showing the connection between a pixel circuit and a light-emitting device in a display panel according to an embodiment of the present disclosure.

As shown in FIG. 2, the pixel circuits 10 in the driving region 102 include at least first pixel circuits 110 and second pixel circuits 120. The first pixel circuits 110 are used to drive the light-emitting devices corresponding to the light-transmitting region 101, that is, the first light-emitting devices 301. The second pixel circuits 120 are used to drive the light-emitting devices corresponding to the driving region 102, that is, the second light-emitting devices 302.

In some embodiments of the present disclosure, as shown in FIGS. 1 and 2, the driving region 102 may include a pixel region 1021 and an edge region 1022. The pixel region 1021 at least partially surrounds outside of the light-transmitting region 101, and one edge of the light-transmitting region 101 may at least partially overlap with one edge of the pixel region 1021. The edge region 1022 may surround the outside of the pixel region 1021, and the edge region 1022 may be provided with peripheral circuits for inputting driving signals to the pixel circuits 10. The peripheral circuits may include a gate driving circuit, a light-emitting control circuit, a power supply circuit, and the like, and embodiments of the present disclosure do not impose specific limitations on this.

Of course, in some other embodiments of the present disclosure, the pixel region 1021 may completely surround the light-transmitting region 101, and the edge region 1022 may surround the outside of the pixel region 1021.

Further, all the first pixel circuits 110 may be distributed in the pixel region 1021, and all the second pixel circuits 120 may also be distributed in the pixel region 1021. Alternatively, a part of the second pixel circuits 120 may be arranged in the pixel region 1021, all the first pixel circuits 110 are distributed in the pixel region 1021, and the other second pixel circuits 120 are arranged in the edge region 1022. Also, a plurality of first interconnection holes 100 are arranged in the pixel region 1021, and the first interconnection holes 100 are connected to the pixel circuits 10 in a one-to-one correspondence, so as to output driving signals.

Further, the pixel circuits 10 are arranged in an array, and each of the columns of first pixel circuits 110 are located between the columns of second pixel circuits 120, and at most one column of the first pixel circuits 110 is arranged between two adjacent columns of the second pixel circuits 120. One or more columns of second pixel circuits 120 may be arranged between two adjacent columns of the first pixel circuits 110.

In order to ensure that there is enough space in the driving region 102 to accommodate the first pixel circuits 110 and the second pixel circuits 120 without reducing the number of the pixel circuits 10, at least a part of the pixel circuits 10 can be compressed along the row direction to reduce the widths of the pixel circuits 10 in the row direction. Under the premise that the size of the driving backplate 1 is the same, more areas can be set aside in the driving region 102 for arranging the first pixel circuits 110. The width of each of the pixel circuits 10 refers to the length of the orthographic projection of the pixel circuit 10 on the driving backplate 1 along the row direction.

The structure of the pixel circuits 10 will be described below with using examples.

Figure 3:
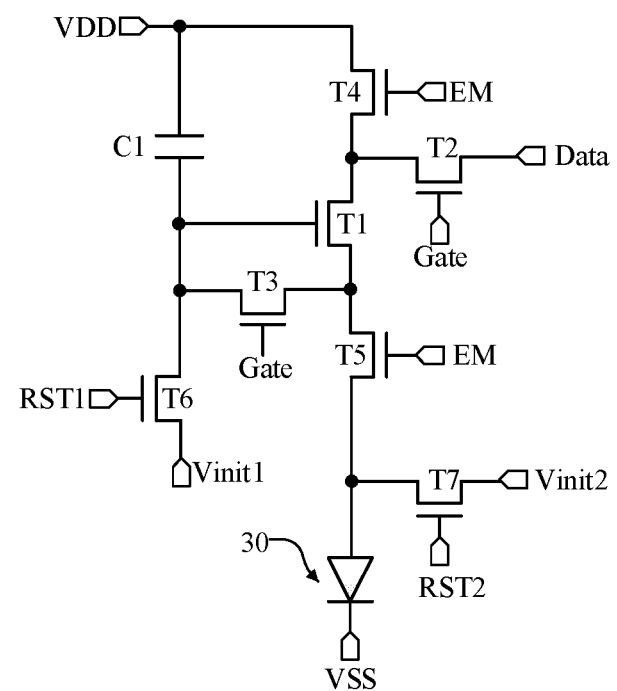
FIG. 3 is an equivalent circuit diagram of a pixel circuit in a display panel according to an embodiment of the present disclosure.
Figure 4:
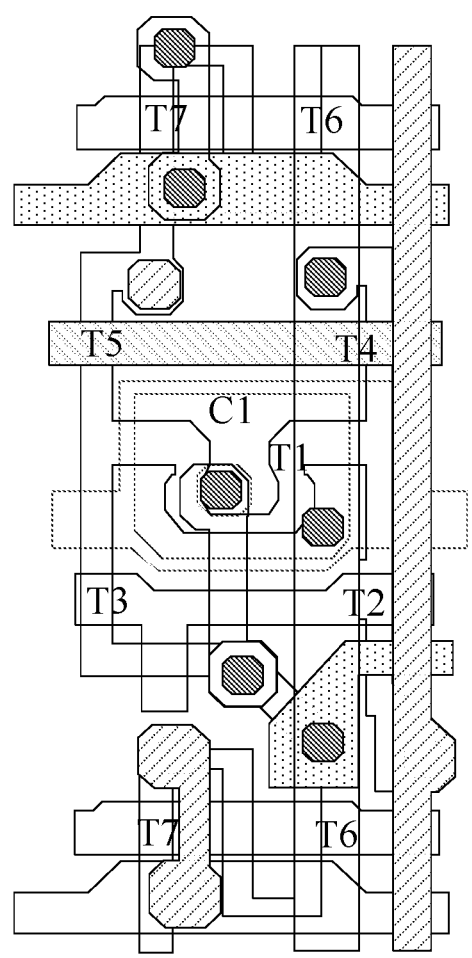
FIG. 4 is a schematic structural diagram of a pixel circuit in a display panel according to an embodiment of the present disclosure.

In some embodiments of the present disclosure, as shown in FIGS. 3 and 4, each of the pixel circuits 10 (the first pixel circuits 110 and the second pixel circuits 120) may be a 7T1C structure, that is, including 7 transistors and 1 capacitor. The 7T1C pixel circuit includes a driving transistor T1, a data writing transistor T2, a threshold compensation transistor T3, a first light-emitting control transistor T4, a second light-emitting control transistor T5, a first reset transistor T6, a second reset transistor T7 and a storage capacitor C1. The pixel circuit may be connected to a gate signal terminal Gate, a data signal terminal Data, reset signal terminals RST1 and RST2, a light-emitting control signal terminal EM, a power supply terminal VDD, initial power supply terminals Vinit1 and Vinit2, and a light-emitting device. The light-emitting device may also be connected to a power supply terminal VSS. The pixel circuit 10 may be used to drive the connected light-emitting device 30 to emit light in response to signals provided by the connected signal terminals.

In addition, transistors can be divided into N-type and P-type transistors according to their characteristics. The embodiments of the present disclosure are described by taking the transistors all adopting P-type transistors as an example. Based on the description and teachings of the present disclosure, those of ordinary skill in the art can easily think of using N-type transistors for at least part of the transistors in the pixel circuit structure of the embodiments of the present disclosure, that is, using N-type transistors or a combination of N-type transistors and P-type transistors without any creative work. Therefore, these implementations are also within the protection scope of the embodiments of the present disclosure.

In some other embodiments of the present disclosure, the pixel circuit 10 may also adopt other structures, as long as the light-emitting device 30 can be driven to emit light, and its structure is not limited to the disclosed structure details.

Based on the above pixel circuit 10, taking the structure of one transistor as an example, the driving backplate 1 may include an active layer, a first gate insulating layer, a gate electrode, a second gate insulating layer, a dielectric layer, a first source and drain layer, a first planarization layer, a second source and drain layer, and a second planarization layer which are sequentially stacked on a substrate to form a transistor, and the specific structure of the transistor is not limited to this. The first interconnection holes 100 can be arranged in the second planarization layer, so that the leads 21 can be connected to the second source and drain layer.

Figure 5:
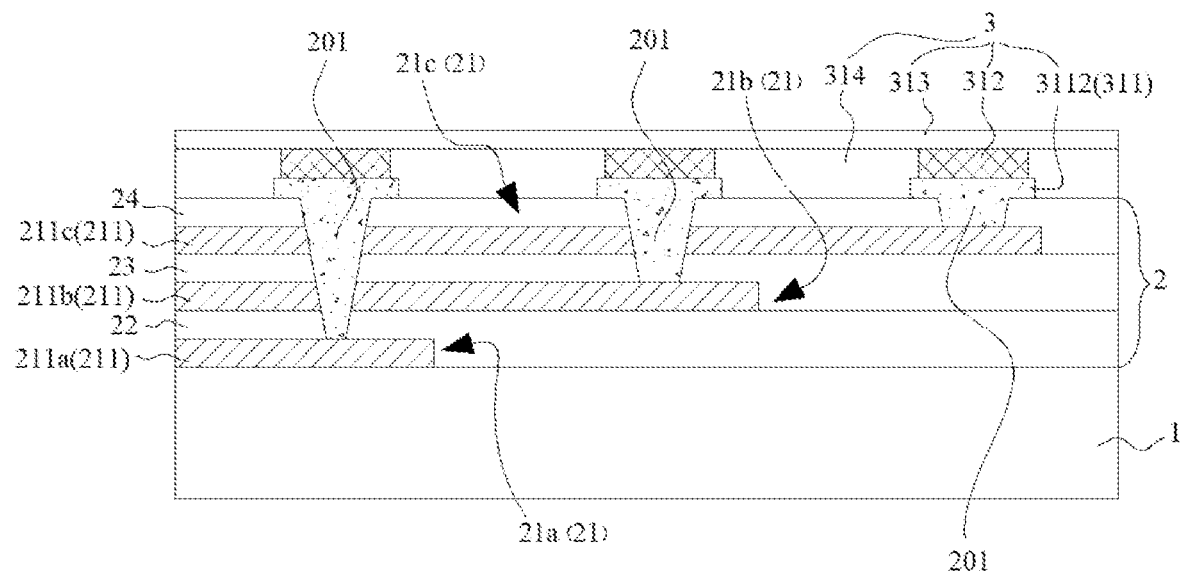
FIG. 5 is a schematic cross-sectional view of a display panel according to an embodiment of the present disclosure.

As shown in FIG. 5, the interconnection layer 2 is arranged on a side of the driving backplate 1, for example, the interconnection layer 2 is arranged on a surface of the second planarization layer away from the substrate. The interconnection layer 2 can cover the light-transmitting region 101 and the driving region 102, and the interconnection layer 2 includes multiple layers of lead layers 21 which are apart from each other. Each lead layer 21 includes a plurality of leads 211 which are apart from each other. The orthographic projection of each lead 211 on the driving backplate 1 extends from the light-transmitting region 101 to the driving region 102. Each lead 211 is connected to a first pixel circuit 110 through a first interconnection hole 100, that is, each lead 211 is only used for transmitting a signal from one first pixel circuit 110.

Figure 7:
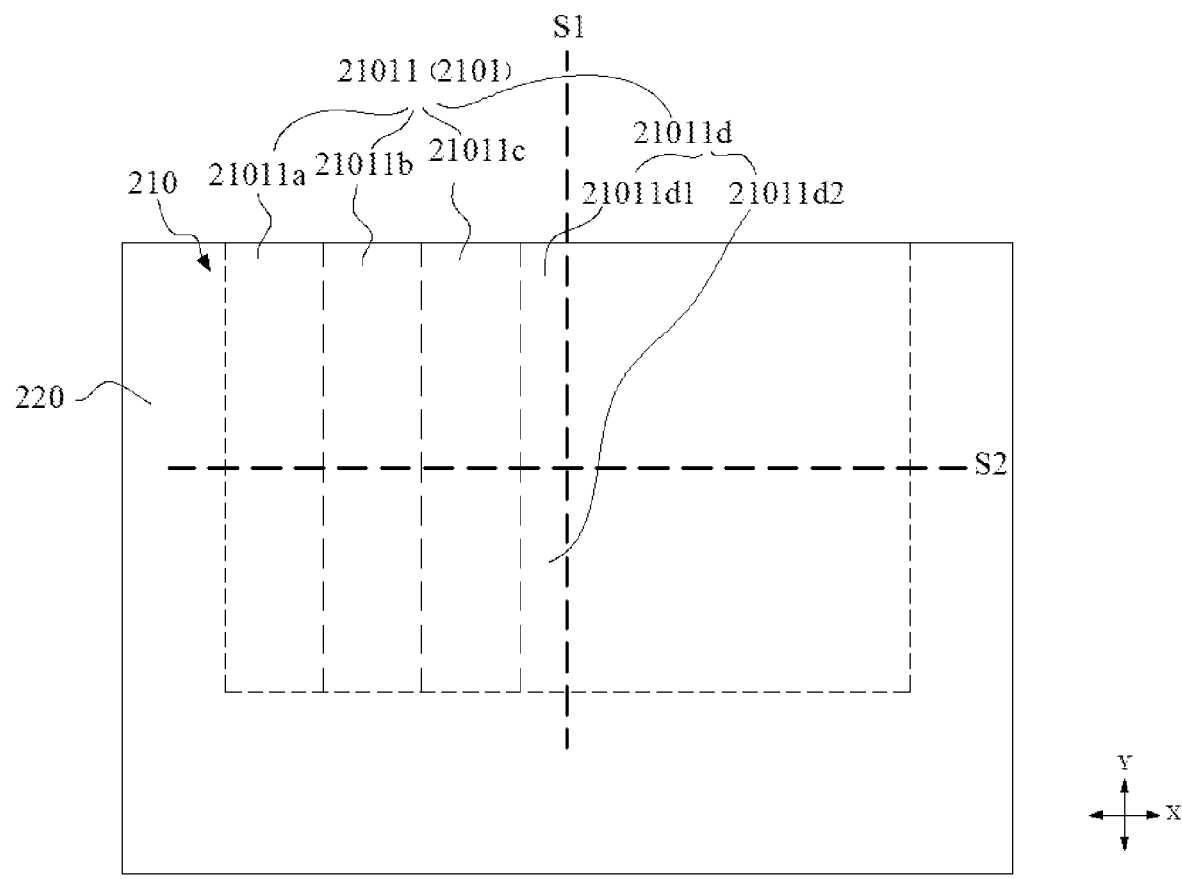
FIG. 7 is a schematic diagram of wiring regions of an interconnection layer in a display panel according to an embodiment of the present disclosure.

As shown in FIG. 7, the interconnection layer 2 has an interconnection region 210 corresponding to the light-transmitting region 101 and a wiring region 220 corresponding to the driving region 102. The boundary of the interconnection region 210 coincides with the boundary of the light-transmitting region 101, and the boundary of the wiring region 220 coincides with the boundary of the drive region 102. Meanwhile, the interconnection region 210 may include two interconnection portions 2101 separated on two sides of a first central axis S1. The first central axis S1 is a central axis of the interconnection region 210 extending along the column direction. Each interconnection portion 2101 has a plurality of second interconnection holes 201. The second interconnection holes 201 are connected to the leads 211 in a one-to-one correspondence. Any one of the first light-emitting devices 301 can be connected to a corresponding first pixel circuit 110 through a second interconnection hole 201 and a lead 211. Each of the second interconnection holes 201 may be a via structure in the interconnection layer 2. Since the leads 211 connected to the second interconnection holes 201 may be located in different lead layers 21, different second interconnection holes 201 may have different depths.

The material of the leads 211 of each lead layer 21 may be transparent materials such as Indium Tin Oxide (ITO) or Indium Gallium Zinc Oxide (IGZO).

In some embodiments of the present disclosure, as shown in FIG. 5, the number of lead layers 21 may be three, including a first lead layer 21a, a second lead layer 21b and a third lead layer 21c which are arranged from the driving backplate 1 to the light-emitting layer 3. The leads 211 in the first lead layer 21a include first leads 211a, the leads 211 in the second lead layer 21b include second leads 211b, and the leads 211 in the third lead layer 21c include third leads 211c.

It should be noted that FIG. 5 is only schematically shown for explaining the relationship between film layers of the display panel, and the structure of the display panel is not limited to the specific details of the lead layers 21 shown in FIG. 5.

As shown in FIG. 5, in order to insulate the lead layers 21, the interconnection layer 2 further includes a first planarization layer 22, a second planarization layer 23 and a third planarization layer 24.

The first lead layer 21a can be arranged on a surface of the driving backplate 1 close to the light-emitting layer 3. The first planarization layer 22 covers the first lead layer 21a and the surface of the driving backplate 1 close to the light-emitting layer 3.

The second lead layer 21b is arranged on a surface of the first planarization layer 22 away from the driving backplate 1. The second planarization layer 23 covers the second lead layer 21b and the surface of the first planarization layer 22 close to the light-emitting layer 3.

The third lead layer 21c is arranged on a surface of the second planarization layer 23 away from the driving backplate 1. The third planarization layer 24 covers the third lead layer 21c and the surface of the second planarization layer 23 close to the light-emitting layer 3. The light-emitting layer 3 is arranged on a surface of the third planarization layer 24 away from the driving backplate 1.

As shown in FIG. 5, the light-emitting layer 3 is arranged on a side of the interconnection layer 2 away from the driving backplate 1. For example, the light-emitting layer 3 is arranged on the surface of the third arranged layer 24 away from the driving backplate 1.

The light-emitting layer 3 covers the interconnection region 210 and the wiring region 220 on the driving backplate 1. The light-emitting layer 3 may include a plurality of light-emitting devices 30. The light-emitting devices 30 include first light-emitting devices 301 located in the interconnection region 210 and second light-emitting devices 302 located in the wiring region 220. Any one of the first light-emitting devices 301 can be connected to a first pixel circuit 110 through a second interconnection hole 201, a lead 211 and a first interconnection hole 201. Any one of the second light-emitting devices 32 can be connected to a second pixel circuit 120 through a first interconnection hole 210.

In some embodiments of the present disclosure, each light-emitting device 30 may be an OLED, which may include a first electrode 311, a light-emitting functional layer 312, and a second electrode 313.

Figure 6:
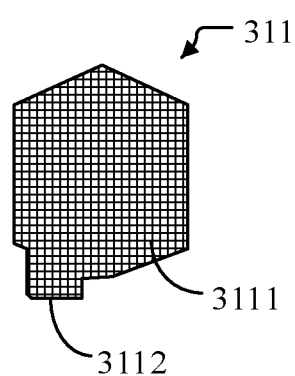
FIG. 6 is a top view of a first electrode in a display panel according to an embodiment of the present disclosure.

The first electrode 311 can be arranged on a surface of the interconnection layer 2 away from the driving backplate 1. For example, the first electrode 311 can be arranged on a surface of the third planarization layer 24 away from the driving backplate 1. As shown in FIG. 5 and FIG. 6, the first electrode 311 serves as an anode of the OLED light-emitting device, and has an electrode portion 3111 and a wiring portion 3112 located outside the edge of the electrode portion 3111. The electrode portion 3111 of each first electrode 311 is connected to a lead 211 through the wiring portion 3112 and a second interconnection hole 201, so as to connect the first pixel circuit 110 with the first electrode 311 of a corresponding light-emitting device 30. The orthographic projections of the interconnected wiring portion 3112 and the second interconnection hole 201 on the drive backplate 1 at least partially overlap.

The light-emitting functional layer 312 may be arranged on a surface of the first electrode 311 away from the driving backplate 1, and may include a hole transport layer, an organic light-emitting layer and an electron transport layer sequentially stacked on the first electrode 311.

The second electrode 313 serves as a cathode of the OLED light-emitting device, and may be arranged on a surface of the light-emitting functional layer 312 away from the driving backplate 1. The light-emitting functional layer 312 can be driven to emit light by applying an electrical signal to the first electrode 311 and the second electrode 313.

The above is the structure of one light-emitting device 30. In the entire display panel, the first electrodes 311 of light-emitting devices 30 can be made of the same material, and are simultaneously formed through a patterning process. Materials of the light-emitting functional layers 312 of light-emitting devices 3 which emit light of different colors may be different. Meanwhile, light-emitting devices 30 can share the same second electrode 313, that is, the second electrode 313 can cover individual light-emitting functional layers 312 at the same time. In addition, in order to limit the light-emitting range of each light-emitting device 30, the light-emitting layer 3 may further include a pixel definition layer 314, which may be arranged on the surface of the interconnection layer 2 away from the driving backplate 1 and has openings exposing the first electrodes 311. The light-emitting functional layers 312 can cover the first electrodes 311 in individual openings, and expose the electrode portions 3111, the wiring portions 3112 are located outside the openings, and the second electrode 313 can cover the surface of the pixel definition layer away from the driving backplate 1, and is recessed into the openings.

Further, in order to make the brightness of the region of the light-emitting layer 3 corresponding to the light-transmitting region 101 and the brightness of the region of the light-emitting layer 3 corresponding to the driving region 102 consistent, the density of the first light-emitting devices 301 in the region corresponding to the light-transmitting region 101 can be the same as the density of the second light-emitting devices 302 in the region corresponding to the driving region 102.

The way of connecting the light-emitting devices and the pixel circuits through the leads 211 will be described in detail below.

As shown in FIGS. 7 to 12, with the central axis of the interconnection region 210 in the column direction as the first central axis S1, the light-transmitting region 101 can be divided into two interconnection portions 2101 distributed in the row direction. The first light-emitting devices 301 are distributed in the two interconnection portions 2101.

The two interconnection portions 2101 are symmetrical with respect to the first central axis S1, and the first light-emitting devices 301 and their connected leads 211 in the two interconnection portions 2101 are also symmetrically arranged with respect to the first central axis S1.

Taking one of the interconnection portions 2101 as an example, the first interconnection holes 100 and the second interconnection holes 201 are arranged in a plurality of hole rows 001 distributed along the column direction. Each hole row 001 includes a plurality of first interconnection holes 100. The second interconnection holes 201 are arranged in a part of the hole rows 001. A first interconnection hole 100 and a second connection hole 201 connected to the same lead 211 are located in the same hole row 001 and form a hole group 002. In two adjacent hole groups 002, a first interconnection hole 100 and a second interconnection hole 201 in one of the hole groups 002 are located between a first interconnection hole 100 and a second interconnection hole 201 in the other one of the hole groups 002.

In any one of the hole groups 002, the length of a lead 211 in the row direction is the same as the distance between the first pixel circuit 110 and the first light-emitting device 301 or differs from the distance between the first pixel circuit 110 and the first light-emitting device 301 by a specified length, so as to perform compensation by external compensation to improve color shift.

In some embodiments of the present disclosure, there are N hole rows 001, and each of the second interconnection holes 201 is arranged in one of i-th to j-th hole rows, N, i and j are positive integers, and $1 \leq i \leq j \leq N$.

In any two adjacent hole rows 001 of the i-th to j-th hole rows 001, leads 211 connected to at least a part of the second interconnection holes 201 in one of the two adjacent hole rows 001 are arranged between the two adjacent hole rows 001.

For example, leads 21 connected to second interconnection holes 201 in a k-th hole row 001 are arranged between (k−1)-th and k-th hole rows 001, k is positive integer, and $i < k \leq j$;

leads 211 connected to second interconnection holes 201 in the i-th hole row are arranged on a side of the i-th hole row 001 away from the j-th hole row 001.

Further, since the space between two adjacent hole rows 001 can accommodate a limited number of leads 211, in at least one of the i-th to j-th hole rows 001, partial regions of leads 211 connected to at least a part of second interconnection holes 201 are arranged on a side of the i-th hole row 001 away from the j-th hole row 001.

Further, the wiring region 220 includes a main body region and a peripheral region, the main body region at least partially surrounds outside of the interconnection region 210, and the peripheral region surrounds outside of the main body region and the interconnection region 210; at least part of the first pixel circuits 110 are distributed in a region of the driving backplate 1 corresponding to the main body region.

At least partial regions of leads 211 connected to at least a part of second interconnection holes 201 in the i-th hole row 001 are arranged in the peripheral region.

In at least one of the i-th to j-th hole rows 001, at least partial regions of leads 211 connected to at least a part of second interconnection holes 201 are arranged on a side of the j-th hole row 001 away from the i-th hole row 001.

In some embodiments of the present disclosure, each of the interconnection portions 2101 includes a plurality of sub-regions 21011 distributed along the row direction, and each of the sub-regions 21011 is provided with the second interconnection holes 201. Leads 211 connected to the first light-emitting devices 301 in the same sub-region 21011 are arranged in the same lead layer 21.

For example, sub-regions 21011 of a same interconnection portion 2101 include a first sub-region 21011a, a second sub-region 21011b and a third sub-region 21011c that are sequentially distributed along the row direction toward the first central axis S1. Leads 211 connected to second interconnection holes 201 in the first sub-region 21011a are the first leads 211a, leads 211 connected to second interconnection holes 201 in the second sub-region 21011b are the second leads 211b, and leads 211c connected to second interconnection holes 201 in the third sub-region 21011c are the third leads 211c.

Further, if $i < k \leq j$, a first lead 211a, a second lead 211b and a third lead 211c connected to second interconnection holes 201 in a k-th hole row 001 are arranged between (k−1)-th and k-th hole rows 001. A first lead 211a, a second lead 211b and a third lead 211c connected to second interconnection holes 201 in an i-th hole row 001 are arranged on a side of the i-th hole row 001 away from a j-th hole row 001.

Further, in some embodiments of the present disclosure, the leads 211 of the first lead layer 21a further include fourth leads 211d. Sub-regions 21011 of the same interconnection portion 2101 include a fourth sub-region 21011d arranged between the third sub-region 21011c and the first central axis S1. Leads 211 connected to second interconnection holes 201 in the fourth sub-region 21011d are the fourth leads.

At least partial regions of at least a part of the fourth leads 211d are arranged on a side of the i-th hole row 001 away from the j-th hole row. At least partial regions of at least a part of the fourth leads 211d are arranged on a side of the j-th hole row 001 away from the i-th hole row.

Figure 8:
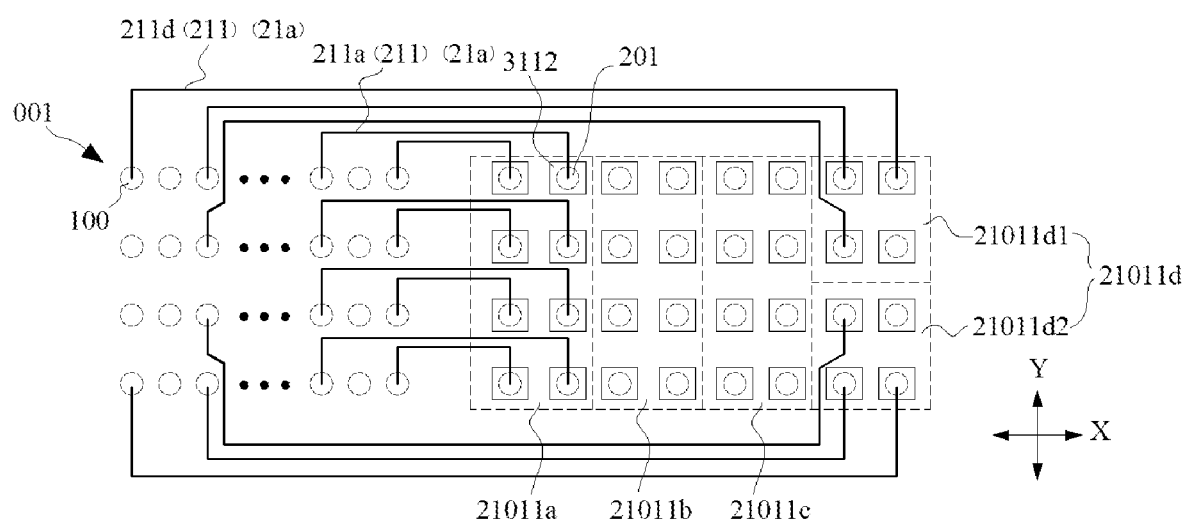
FIG. 8 is a schematic diagram showing the connection of a first lead layer in a display panel according to an embodiment of the present disclosure.
Figure 9:
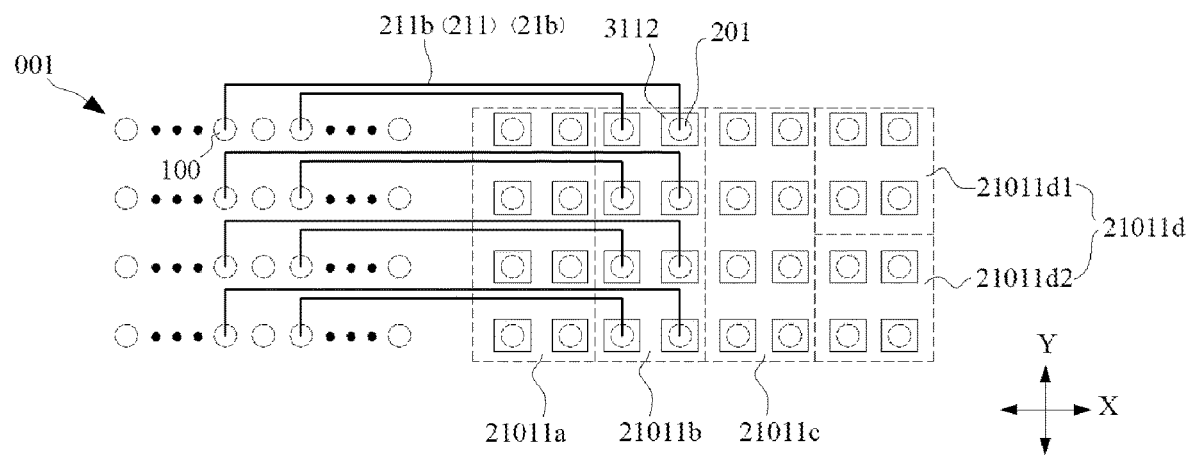
FIG. 9 is a schematic diagram showing the connection of a second lead layer in a display panel according to an embodiment of the present disclosure.
Figure 10:
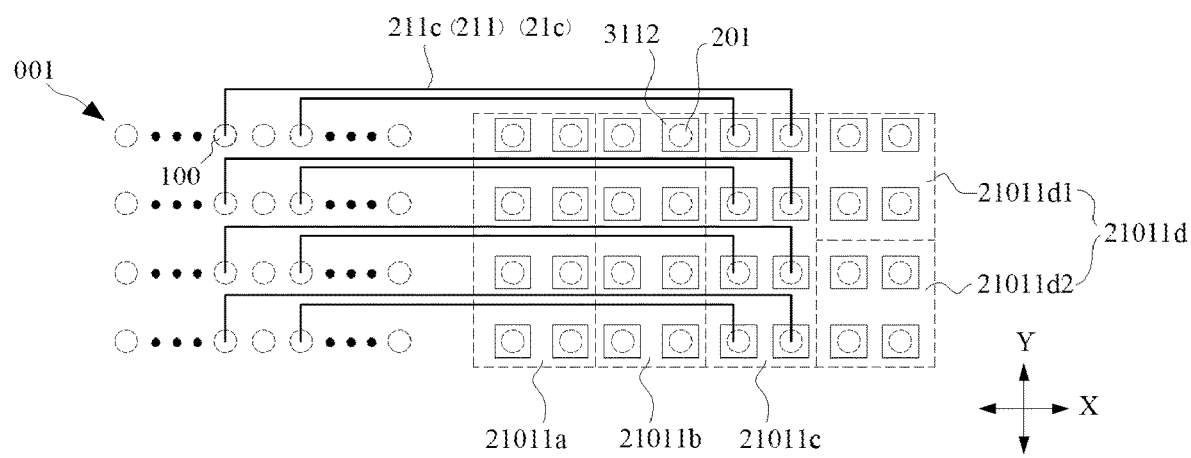
FIG. 10 is a schematic diagram showing the connection of a third lead layer in a display panel according to an embodiment of the present disclosure.

Further, as shown in FIG. 7 and FIG. 8, the fourth sub-region 21011d includes a first sub-division 21011d1 and a second sub-division 21011d2 separated on both sides of a second central axis S2. The second central axis S2 is a central axis of the interconnection region 210 extending along the row direction. A part of second interconnection holes 201 in the i-th to k-th hole rows 001 are arranged in the first sub-division 21011d1, and a part of second interconnection holes 201 in the (k+1)-th to j-th hole rows 001 are arranged in the second sub-division 21011d2, k+1≤j.

At least partial regions of the fourth leads 211d connected to second interconnection holes 201 in the first sub-division 21011d1 are arranged on the side of the i-th hole row 001 away from the j-th hole row 001.

At least partial regions of the fourth leads 211d connected to second interconnection holes 201 in the second sub-division 21011d2 are arranged on the side of the j-th hole row 001 away from the i-th hole row 001.

Figure 11:
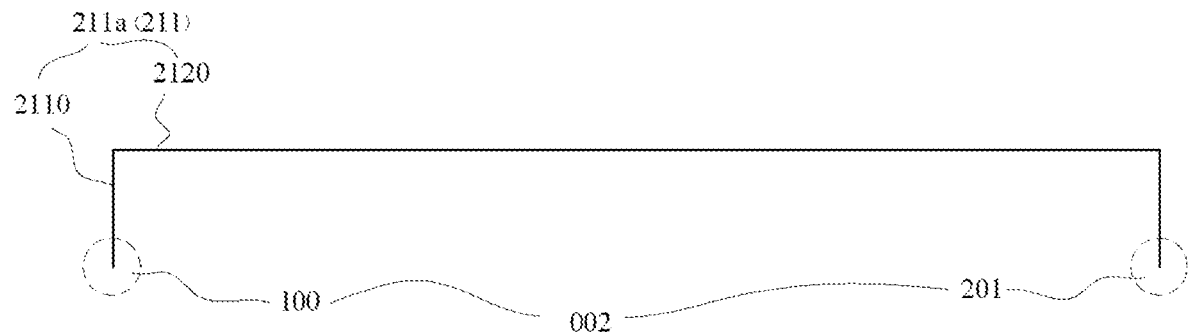
FIG. 11 is a schematic diagram of a first lead in a display panel according to an embodiment of the present disclosure.
Figure 12:
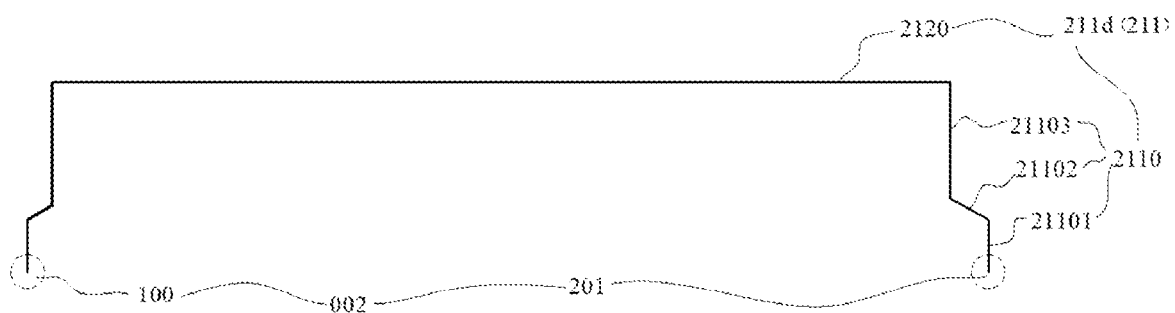
FIG. 12 is a schematic diagram of a fourth lead in a display panel according to an embodiment of the present disclosure.

In some embodiments of the present disclosure, as shown in FIGS. 11 and 12, each of the leads 211 includes two lead-out sections 2110 and an extension section 2120 connecting the two lead-out sections 2110, the lead-out sections 2110 extend along the column direction, and the extension section 2120 extends along the row direction. The length of the extension section 2120 of any one of the first lead 211a, the second lead 211b and the third lead 211c is the same as the distance between a first interconnection hole 100 and a second interconnection hole 201 which are connected to the any one of the first lead 211a, the second lead 211b and the third lead 211c. The length of each of the lead-out sections 2110 of any one of the first lead 211a, the second lead 211b and the third lead 211c along the column direction is smaller than the distance between two adjacent hole rows 001. The distance between a first interconnection hole 100 and a second interconnection hole 201 is the distance between the center of the first interconnection hole 100 and the center of the orthographic projection of the second interconnection hole 201 on the drive backplate 1.

In some embodiments of the present disclosure, as shown in FIG. 12, if i<k≤j, each of lead-out sections 2110 of one of the fourth leads 211d connected to the k-th hole row 001 includes a first section 21101, a second section 21102 and a third section 21103 distributed along the column direction, one end of the first section 21101 is connected to one of the second interconnection holes 201 and the other end of the first section 21101 is connection to one end of the second section 21102, the other end of the second section 21102 is connected to one end of the third section 21102, and the other end of the third section 21103 is connection to one end of the extension section 2120.

The first section 21101 and the third section 21103 extend linearly along the column direction, and the third section 21103 is arranged on a side of a second interconnection hole 201 connected to the first section 21101 away from or close to the first central axis S1. A column of second interconnection holes 201 are arranged on an extension line in the extension path of the first section 21101. The second section 21102 extends along a straight line and forms a predetermined angle with the first section 21101 and the third section 21103, so that the third section 21103 is arranged parallel to the first section 21101.

The length of the extension section 2120 of each of the fourth leads 211d connected to the k-th hole row 001 differs from a distance between a first interconnection hole 100 and a second interconnection hole 201 connected to the each of the fourth leads 211d by a specified length, and the specified length is a distance between the first section 21101 and the third section 21103 in the row direction.

The length of an extension section 2120 of each of the fourth leads 211d connected to the i-th and j-th hole rows 001 is the same as a distance between a first interconnection hole 100 and a second interconnection hole 201 connected to the each of the fourth leads 211d.

An embodiment of the present disclosure further provides a display device, which may include the display panel of any one of the foregoing embodiments. For the structure and beneficial effects of the display panel, reference may be made to the foregoing embodiments of the display panel, which will not be repeated here.

Figure 13:
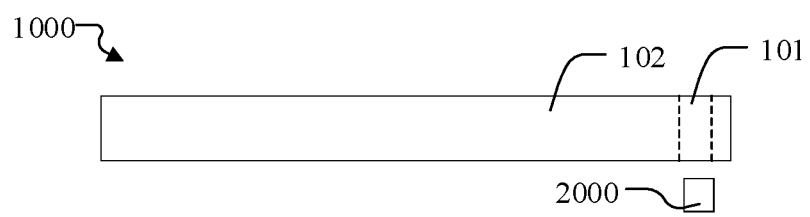
FIG. 13 is a schematic diagram of a display device according to an embodiment of the present disclosure.

An embodiment of the present disclosure further provides a terminal device. As shown in FIG. 13, the terminal device may include a display device 1000 and a camera device 2000.

The display device 1000 may be the display device of any one of the above-mentioned embodiments, and for its structure and beneficial effects, reference can be made to the above-mentioned embodiments of the display panel and the display device, which will not be repeated here.

The camera device 2000 can be disposed on the back side of the display device 1000, that is, the side opposite to the light-emitting direction. For example, if the light-emitting device of the display device 1000 is a top-emission structure, that is, the light-emitting device emits light in the direction away from the driving backplate 1, the camera device 2000 can be disposed on a side of the driving backplate 1 away from the light-emitting layer 3, and the camera device 2000 can be directly opposite to the light-transmitting region 101 for capturing images through the light-transmitting region 101. If the light-emitting device of the display device 1000 is a bottom emission structure, the camera device 2000 can be disposed on a side of the light-emitting layer 3 away from the driving backplate 1. The camera device 2000 may include a lens, a photoelectric sensor, etc., and the specific structure of the camera device 2000 is not particularly limited here, as long as it can capture images.

The terminal device according to embodiments of the present disclosure may be an electronic device with display and photographing functions, such as a mobile phone, a tablet computer, a TV, etc., which will not be listed one by one here.

Other embodiments of the present disclosure will readily occur to those skilled in the art upon consideration of the specification and practice of the technical solutions disclosed herein. The present disclosure is intended to cover any variations, uses, or adaptations that follow the general principles of the present disclosure and include common general knowledge or techniques in the technical field not disclosed by the present disclosure. The description and examples are to be regarded as exemplary only, and the true scope and spirit of the present disclosure are defined by the appended claims.

What is claimed is:

1. A display panel, comprising:
a driving backplate having a light-transmitting region and a driving region at least partially surrounding outside of the light-transmitting region, wherein the driving region has a plurality of pixel circuits, the plurality of pixel circuits comprise first pixel circuits and second pixel circuits, the driving backplate has a plurality of first interconnection holes, and any one of the pixel circuits is connected to one of the first interconnection holes;
an interconnection layer arranged on a side of the driving backplate and covering the light-transmitting region and the driving region, wherein:
the interconnection layer comprises a plurality of lead layers which are mutually apart from each other, and each of the lead layers comprises a plurality of leads which are mutually apart from each other;
the interconnection layer has an interconnection region corresponding to the light-transmitting region and a wiring region corresponding to the driving region, and the interconnection region comprises two interconnection portions separated on both sides of a first central axis;
the first central axis is a central axis of the interconnection region extending along a column direction;
each of the interconnection portions has a plurality of second interconnection holes, and any one of the second interconnection holes is connected with one of the first interconnection holes through one of the leads; and
a light-emitting layer arranged on a side of the interconnection layer away from the driving backplate and comprising a plurality of light-emitting devices, wherein the light-emitting devices comprise a plurality of first light-emitting devices in the interconnection portions and a plurality of second light-emitting devices in the wiring region, any one of the first light-emitting devices is connected to one of the second interconnection holes, and any one of the second light-emitting devices is connected to one of the first interconnection holes;
wherein the first interconnection holes and the second interconnection holes are arranged in a plurality of hole rows distributed along the column direction, the second interconnection holes are arranged in a part of the hole rows, a first interconnection hole and a second interconnection hole which are connected to a same lead are in a same hole row to form a hole group; in two adjacent hole groups, a first interconnection hole and a second interconnection hole in one of the two adjacent hole groups are arranged between a first interconnection hole and a second interconnection hole in another one of the two adjacent hole groups;
wherein a length of any one of the leads in a row direction is the same as a distance between a first interconnection hole and a second interconnection hole which are connected to the lead, or the length of any one of the leads in the row direction differs from the distance between the first interconnection hole and the second interconnection hole which are connected to the lead by a specified length.

2. The display panel according to claim 1, wherein there are N hole rows, and each of the second interconnection holes is arranged in one of i-th to j-th hole rows, N, i and j are positive integers, and 1≤i<j≤N;
wherein in any two adjacent hole rows of the i-th to j-th hole rows, leads connected to at least a part of the second interconnection holes in one of the two adjacent hole rows are arranged between the two adjacent hole rows.

3. The display panel according to claim 2, wherein leads connected to second interconnection holes in a k-th hole row are arranged between (k−1)-th and k-th hole rows, k is positive integer, and i<k≤j;
wherein leads connected to second interconnection holes in the i-th hole row are arranged on a side of the i-th hole row away from the j-th hole row.

4. The display panel according to claim 2, wherein in at least one hole row of the i-th to j-th hole rows, partial regions of leads connected to at least a part of second interconnection holes are arranged on a side of the i-th hole row away from the j-th hole row.

5. The display panel according to claim 4, wherein the wiring region comprises a main body region and a peripheral region, the main body region at least partially surrounds outside of the interconnection region, and the peripheral region surrounds outside of the main body region and the interconnection region; at least part of the first pixel circuits are distributed in a region of the driving backplate corresponding to the main body region;
wherein at least partial regions of leads connected to at least a part of second interconnection holes in the i-th hole row are arranged in the peripheral region.

6. The display panel according to claim 2, wherein in at least one of the i-th to j-th hole rows, at least partial regions of leads connected to at least a part of second interconnection holes are arranged on a side of the j-th hole row away from the i-th hole row.

7. The display panel according to claim 1, wherein each of the interconnection portions comprises a plurality of sub-regions distributed along the row direction, and each of the sub-regions is provided with the second interconnection holes;
wherein leads connected to second interconnection holes in a same sub-region are arranged in a same lead layer.

8. The display panel according to claim 7, wherein the plurality of the lead layers at least comprise a first lead layer, a second lead layer and a third lead layer which are sequentially distributed from the driving backplate to the light-emitting layer, leads of the first lead layer comprise first leads, leads of the second lead layer comprise second leads, and leads of the third lead layer comprise third leads;
wherein sub-regions of a same interconnection portion comprise a first sub-region, a second sub-region and a third sub-region that are sequentially distributed along the row direction toward the first central axis, leads connected to second interconnection holes in the first sub-region are the first leads, leads connected to second interconnection holes in the second sub-region are the second leads, and leads connected to second interconnection holes in the third sub-region are the third leads.

9. The display panel according to claim 8, wherein in response to i<k≤j:
a first lead, a second lead and a third lead connected to second interconnection holes in a k-th hole row are arranged between (k−1)-th and k-th hole rows;
wherein a first lead, a second lead and a third lead connected to second interconnection holes in an i-th hole row are arranged on a side of the i-th hole row away from a j-th hole row.

10. The display panel according to claim 8, wherein:
the leads of the first lead layer further comprise fourth leads;
sub-regions of the same interconnection portion comprise a fourth sub-region arranged between the third sub-region and the first central axis, and leads connected to second interconnection holes in the fourth sub-region are the fourth leads;
at least partial regions of at least a part of the fourth leads are arranged on a side of the i-th hole row away from the j-th hole row; and
at least partial regions of at least a part of the fourth leads are arranged on a side of the j-th hole row away from the i-th hole row.

11. The display panel according to claim 10, wherein the fourth sub-region comprises a first sub-division and a second sub-division separated on both sides of a second central axis, the second central axis is a central axis of the interconnection region extending along the row direction, a part of second interconnection holes in the i-th to k-th hole rows are arranged in the first sub-division, and a part of second interconnection holes in the (k+1)-th to j-th hole rows are arranged in the second sub-division, k+1≤j;
wherein at least partial regions of the fourth leads connected to second interconnection holes in the first sub-division are arranged on the side of the i-th hole row away from the j-th hole row; and
wherein at least partial regions of the fourth leads connected to second interconnection holes in the second sub-division are arranged on the side of the j-th hole row away from the i-th hole row.

12. The display panel according to claim 11, wherein each of the leads comprises two lead-out sections and an extension section connecting the two lead-out sections, the lead-out sections extend along the column direction, and the extension section extends along the row direction;
wherein a length of the extension section of any one of the first lead, the second lead and the third lead is the same as a distance between a first interconnection hole and a second interconnection hole which are connected to the any one of the first lead, the second lead and the third lead.

13. The display panel according to claim 12, wherein in response to i<k<j:
each of lead-out sections of one of the fourth leads connected to the k-th hole row comprises a first section, a second section and a third section distributed along the column direction, one end of the first section is connected to one of the second interconnection holes and the other end of the first section is connection to one end of the second section, the other end of the second section is connected to one end of the third section, and the other end of the third section is connection to one end of the extension section;
the first section and the third section extend linearly along the column direction, and the third section is arranged on a side of a second interconnection hole connected to the first section away from or close to the first central axis; and
the length of the extension section of each of the fourth leads connected to the k-th hole row differs from a distance between a first interconnection hole and a second interconnection hole connected to the each of the fourth leads by a specified length.

14. The display panel according to claim 12, wherein a length of an extension section of each of the fourth leads connected to the i-th and j-th hole rows is the same as a distance between a first interconnection hole and a second interconnection hole connected to the each of the fourth leads.

15. The display panel according to claim 11, wherein a fourth lead connected to a second interconnection hole in the first sub-division and a fourth lead connected to a second interconnection hole in the second sub-division are symmetrically arranged with respect to the second central axis.

16. The display panel according to claim 1, wherein leads connected to the second interconnection holes in the two interconnection portions are symmetrically arranged with respect to the first central axis.

17. The display panel according to claim 1, wherein the light-emitting device comprises:
a first electrode arranged on a surface of the interconnection layer away from the driving backplate, wherein the first electrode has an electrode portion and a wiring portion arranged outside an edge of the electrode portion, and the wiring portion is connected to one of the leads through one of the second interconnection holes;
a light-emitting functional layer arranged on a surface of the first electrode away from the driving backplate; and
a second electrode arranged on a surface of the light-emitting functional layer away from the driving backplate.

18. A display device, comprising a display panel;
wherein the display panel comprises:
a driving backplate having a light-transmitting region and a driving region at least partially surrounding outside of the light-transmitting region, wherein the driving region has a plurality of pixel circuits, the plurality of pixel circuits comprise first pixel circuits and second pixel circuits, the driving backplate has a plurality of first interconnection holes, and any one of the pixel circuits is connected to one of the first interconnection holes;
an interconnection layer arranged on a side of the driving backplate and covering the light-transmitting region and the driving region, wherein:
the interconnection layer comprises a plurality of lead layers which are mutually apart from each other, and each of the lead layers comprises a plurality of leads which are mutually apart from each other;
the interconnection layer has an interconnection region corresponding to the light-transmitting region and a wiring region corresponding to the driving region, and the interconnection region comprises two interconnection portions separated on both sides of a first central axis;
the first central axis is a central axis of the interconnection region extending along a column direction;
each of the interconnection portions has a plurality of second interconnection holes, and any one of the second interconnection holes is connected with one of the first interconnection holes through one of the leads; and
a light-emitting layer arranged on a side of the interconnection layer away from the driving backplate and comprising a plurality of light-emitting devices, wherein the light-emitting devices comprise a plurality of first light-emitting devices in the interconnection portions and a plurality of second light-emitting devices in the wiring region, any one of the first light-emitting devices is connected to one of the second interconnection holes, and any one of the second light-emitting devices is connected to one of the first interconnection holes;

wherein the first interconnection holes and the second interconnection holes are arranged in a plurality of hole rows distributed along the column direction, the second interconnection holes are arranged in a part of the hole rows, a first interconnection hole and a second interconnection hole which are connected to a same lead are in a same hole row to form a hole group; in two adjacent hole groups, a first interconnection hole and a second interconnection hole in one of the two adjacent hole groups are arranged between a first interconnection hole and a second interconnection hole in another one of the two adjacent hole groups;

wherein a length of any one of the leads in a row direction is the same as a distance between a first interconnection hole and a second interconnection hole which are connected to the lead, or the length of any one of the leads in the row direction differs from the distance between the first interconnection hole and the second interconnection hole which are connected to the lead by a specified length.

19. A terminal device, comprising:
a display device comprising a display panel;
wherein the display panel comprises:
a driving backplate having a light-transmitting region and a driving region at least partially surrounding outside of the light-transmitting region, wherein the driving region has a plurality of pixel circuits, the plurality of pixel circuits comprise first pixel circuits and second pixel circuits, the driving backplate has a plurality of first interconnection holes, and any one of the pixel circuits is connected to one of the first interconnection holes;
an interconnection layer arranged on a side of the driving backplate and covering the light-transmitting region and the driving region, wherein:
the interconnection layer comprises a plurality of lead layers which are mutually apart from each other, and each of the lead layers comprises a plurality of leads which are mutually apart from each other;
the interconnection layer has an interconnection region corresponding to the light-transmitting region and a wiring region corresponding to the driving region, and the interconnection region comprises two interconnection portions separated on both sides of a first central axis;
the first central axis is a central axis of the interconnection region extending along a column direction;
each of the interconnection portions has a plurality of second interconnection holes, and any one of the second interconnection holes is connected with one of the first interconnection holes through one of the leads; and
a light-emitting layer arranged on a side of the interconnection layer away from the driving backplate and comprising a plurality of light-emitting devices, wherein the light-emitting devices comprise a plurality of first light-emitting devices in the interconnection portions and a plurality of second light-emitting devices in the wiring region, any one of the first light-emitting devices is connected to one of the second interconnection holes, and any one of the second light-emitting devices is connected to one of the first interconnection holes;

wherein the first interconnection holes and the second interconnection holes are arranged in a plurality of hole rows distributed along the column direction, the second interconnection holes are arranged in a part of the hole rows, a first interconnection hole and a second interconnection hole which are connected to a same lead are in a same hole row to form a hole group; in two adjacent hole groups, a first interconnection hole and a second interconnection hole in one of the two adjacent hole groups are arranged between a first interconnection hole and a second interconnection hole in another one of the two adjacent hole groups;

wherein a length of any one of the leads in a row direction is the same as a distance between a first interconnection hole and a second interconnection hole which are connected to the lead, or the length of any one of the leads in the row direction differs from the distance between the first interconnection hole and the second interconnection hole which are connected to the lead by a specified length;

wherein the terminal device further comprises:
a camera device arranged on a side of the driving backplate away from the light-emitting layer, wherein the side of the driving backplate is a side opposite to a light-emitting direction, the camera device is arranged facing the light-transmitting region, and the camera device is used for capturing images through the light-transmitting region.

20. The display device according to claim 18, wherein there are N hole rows, and each of the second interconnection holes is arranged in one of i-th to j-th hole rows, N, i and j are positive integers, and $1 \leq i < j \leq N$;
wherein in any two adjacent hole rows of the i-th to j-th hole rows, leads connected to at least a part of the second interconnection holes in one of the two adjacent hole rows are arranged between the two adjacent hole rows.

* * * * *